United States Patent [19]

Curtis et al.

[11] Patent Number: 4,573,026
[45] Date of Patent: Feb. 25, 1986

[54] FM MODULATOR PHASE-LOCKED LOOP WITH FM CALIBRATION

[75] Inventors: G. Stephen Curtis, Spokane; David P. Whipple, Greenacres, both of Wash.

[73] Assignee: Hewlett-Packard Company, Palo Alto, Calif.

[21] Appl. No.: 584,668

[22] Filed: Feb. 29, 1984

[51] Int. Cl.[4] .................. H03C 3/08; H03C 3/20; H03L 7/06; H04B 1/00
[52] U.S. Cl. .................................. 332/18; 332/19; 332/30 V; 331/17; 331/23; 455/42; 455/75; 455/113; 455/119
[58] Field of Search ............... 331/17, 23; 332/18, 332/19, 30 V; 455/42, 75, 113, 119

[56] References Cited

U.S. PATENT DOCUMENTS

| 4,052,672 | 10/1977 | Enderby et al. | 332/19 X |
| 4,282,497 | 8/1981 | Hulbert | 332/19 |
| 4,309,674 | 1/1982 | Owen | 332/19 X |

FOREIGN PATENT DOCUMENTS

| 0039417 | 3/1980 | Japan | 332/19 |
| 0152333 | 11/1981 | Japan | 331/17 |
| 1556392 | 11/1979 | United Kingdom | 332/19 |

Primary Examiner—Eugene R. LaRoche
Assistant Examiner—D. C. Mis
Attorney, Agent, or Firm—Leslie G. Murray

[57] ABSTRACT

Apparatus to provide calibrated frequency modulation (FM) of frequencies generated in a phase-locked loop is disclosed. A phase-locked loop (PLL) includes a voltage-controlled oscillator (VCO) which is locked to a loop frequence signal frequency. A modulo-10 divider is included which adds integral multiples of two pi radians of phase to the output signal of the VCO whenever the modulus of the divider is reduced by an integer. This forces the PLL to step change the loop frequency by an integral multiple of the reference frequency. A sampling circuit senses and measures the change in the VCO control voltage resulting from the step change in the loop frequency. The change in the control voltage is a measure of the VCO gain at that frequency. The change in the control voltage is converted to a digital number which is loaded into a multiplying digital-to-analog converter (DAC) to adjust the gain of the DAC. The effective combined gain of the DAC and the VCO is constant and independent of the VCO gain over the entire range of the VCO thereby providing an equal amount of modulation from an FM signal at any frequency of the VCO.

9 Claims, 3 Drawing Figures

4,573,026

FM MODULATOR PHASE-LOCKED LOOP WITH FM CALIBRATION

BACKGROUND

1. Field of Invention

The invention relates generally to frequency modulation of an RF carrier and more particularly to frequency modulation calibration in a phase-locked loop.

2. Description of the Prior Art

It is well known in the art to synthesize frequencies by means of phase-locked loop circuits. The phase-locked loop (PLL) includes a tunable oscillator (typically a voltage-controlled oscillator (VCO)) whose output is locked to a known reference signal by means of a phase comparator. The phase comparator generates an output voltage or current that is proportional to the phase difference between the two signals. The phase comparator output is fed back to the input of the VCO and used to tune the VCO. This forces the VCO output to have exactly the same frequency as the reference signal. By interposing a divide-by-N block in the circuit comparator, the reference frequency may instead be compared with the VCO frequency divided by N; the VCO output will then be locked to N times the reference frequency. By varying N, it is possible to generate frequencies which are the Nth harmonics of the reference frequencies, where N is an integer. Another technique, called fractional N, makes it possible to generate frequencies that are any rational multiple of the reference frequency. Such a technique is disclosed in U.S. Pat. No. 3,928,813 issued to Charles A. Kingsford-Smith on Dec. 23, 1975, entitled "Device for Synthesizing Frequencies which are Rational Multiples of a Fundamental Frequency".

In some applications, it is often desired to frequency modulate (FM) the synthesized signal. A PLL is in effect a control system that maintains a constant phase difference between two signals. Any variations in the phase of one signal relative to the other are removed by the PLL. This property of a PLL is utilized to suppress noise and clean up a signal; however, this property also tends to suppress frequency modulation of a signal in PLL.

Audio FM may be accomplished by splitting the FM signal into two separate signal paths. One path is AC-coupled to the VCO and will be the primary path for the FM signal for frequencies that are above the bandwidth of the PLL. FM at frequencies inside the PLL bandwidth is integrated and then injected into a summing node at the output of the phase detector. Since phase is the integral of frequency, FM at frequencies within the PLL bandwidth is accomplished by phase modulation (PM). Properly scaling the gains of each signal path provides flat FM response both inside and outside the PLL bandwidth.

One of the primary problems encountered when frequency modulating a signal in a PLL is that the gain of the VCO is not constant—generally the gain of the VCO varies with the frequency of the VCO. One solution to this problem is to FM only at a single VCO frequency. Another solution injects an FM calibration signal into the loop through a variable-gain amplifier, then the gain of the amplifier is varied to match the frequency demodulated VCO output signal to a reference signal.

SUMMARY OF THE INVENTION

In accordance with the present invention, calibrated frequency modulation (FM) is provided; i.e., at any frequency of the VCO, the same modulation input signal will produce the same amount of frequency modulation of the output signal. Since the VCO gain is not a constant, but varies as a function of the VCO frequency, the primary objective of the FM calibration circuitry is to make the VCO gain, as seen by the PLL, seem to be constant.

A PLL is provided comprising a VCO, a divide-by-two circuit, a three-modulus prescaler, a divide-by-N circuit, a phase difference detector, and an AC coupled signal patch for modulation that is outside the loop bandwidth. Changing the modulus of the prescaler from ten to nine will cause the divide-by-N circuit to see two additional cycles of phase (four pi radians) per reference period. The addition of two cycles per reference period will cause the loop step to change its frequency by 200 kHz (it being understood that the PLL utilizes a reference signal frequency of 100 kHz).

A sample circuit samples the change in the VCO input control voltage caused by the step change in frequency. The change in the control voltage over a frequency step of 200 kHz provides a precise measure of the gain of the VCO at the particular frequency that the PLL is locked to (a rational multiple of the reference signal frequency). The voltage change is next amplified and scaled by an amplifier and an analog-to-digital converter (A/D), then loaded into a multiplying digital-to-analog converter (DAC) interposed between the phase difference detector and the VCO providing a calibrated VCO input control signal to compensate for the VCO gain at that particular VCO frequency. Each time the PLL frequency is changed, a calibration cycle is initiated and the gain of the DAC reset.

The above-described circuit utilizes the characteristics of the PLL to effectively shift the loop frequency a step change of 200 kHz. Every time the loop frequency is changed, the VCO gain at the new frequency is measured and the gain of the multiplying DAC reset which maintains the combined gain of the DAC and the VCO constant over the entire frequency range of the VCO. Use of the loop itself to generate the step change in loop frequency eliminates the need for separate circuitry to generate the test signal required to measure VCO gain. Further, maintaining the VCO gain effectively constant over the frequency range improves the PLL stability and noise performance.

DESCRIPTION OF THE PREFERRED EMBODIMENT

Figure 1:
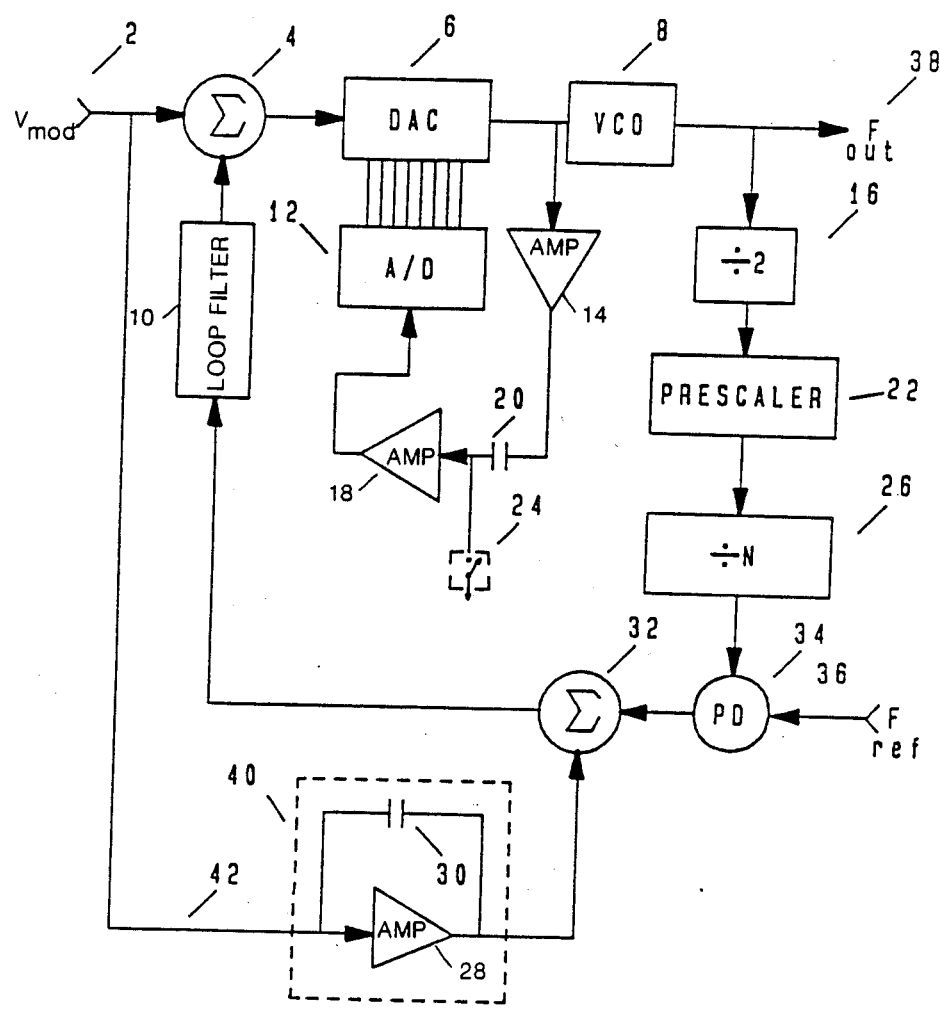
FIG. 1 is a block diagram of a phase-locked loop embodying the principles of the present invention.

FIG. 1 is a block diagram of the preferred embodiment in accordance with the present invention. An FM phase-locked loop (PLL) comprising a voltage-controlled tunable oscillator (VCO) 8, a phase detector 34 and a loop filter 10 having a modulation signal $V_{mod}$ input 2 is provided. The summing block 4 sums the modulation signal input at 2 with output of the loop filter 10. The output of the summing block 4 is scaled by a multiplying digital-to-analog converter (DAC) 6 and then becomes the control voltage input to the VCO 8 on line 7. The divide-by-N block 26 is an electronic counting circuit constituting a frequency divider which divides the output frequency, $F_{out}$ 38, by some number N prior to comparing the output signal phase to the phase of a reference signal, $F_{ref}$ 36 in the phase detector 34. The divide-by-N block 26 allows the PLL to be locked to any rational multiple of the frequency of the reference signal 36. The output of the phase detector 34 is a voltage that is proportional to the difference in phase between its inputs. OP-AMP 28 and capacitor 30 form an integrator 40 which integrates the modulation input signal on line 42 and provides a phase modulation (PM) voltage signal to summing block 32 where the PM voltage signal is summed with the output voltage of the phase detector 34.

For a given loop frequency step change (dF), the change in the VCO control voltage (dV) is proportional to the reciprocal of the VCO gain ($K_{VCO}$):

$$dV(\text{Volts}) = dF(\text{Hz})/K_{VCO}(\text{Hz/Volt}).$$

The loop is forced to step change its frequency by an amount dF. The control voltage step change dV resulting is then measured by a sampling circuit comprised of a buffer amplifier 14, capacitor 20, electronic switch 24, and amplifier 18. The voltage change is converted into a binary number by A/D converter 12 and loaded into the multiplying DAC 6 to adjust the gain of the DAC. The effective gain ($K_v$) of the DAC 6 and the VCO 8 is given by:

$$K_v = KdVK_{VCO} = K(df/K_{VCO})K_{VCO} = KdF,$$

where K is an arbitrary constant. The effective gain of the DAC 6 and the VCO 8 is independent of the VCO gain $K_{VCO}$.

Each time the loop frequency is changed to a new loop frequency (greater than 200 kHz away from the previous loop frequency), an FM calibration cycle is initiated. The desired frequency ($F_d$) is loaded into the divide-by-N block 26 and at the same time a frequency step change signal directs the prescaler 22 to change its modulus from ten to nine. The combined effect of the divide-by-two flip-flop 16 and the prescaler 22 is to add two cycles of phase (four pi radians) per reference period from the output signal, $F_{out}$, 38 of the VCO 8 and the PLL will go to the $F_d$ plus 200 kHz.

The VCO control voltage on line 7 is sensed with buffer amplifier 14, the output of which is applied to the sampling capacitor 20. The electronic switch 24 is closed during this time allowing capacitor 20 to charge to the control voltage on line 7. When the loop has settled to within 1 kHz of the final frequency ($F_d$ plus 200 kHz), the electronic switch 24 is opened and the prescaler modulus is changed from nine to ten. The result is that the loop now locks to the desired frequency, $F_d$. The sampling capacitor 20 sees the change in the control voltage on line 7 which is amplified by amplifier 18 and inputted to the analog-to-digital converter (A/D) 12. The change in control voltage on line 7 seen by capacitor 20 exactly equals 200 kHz/$K_{VCO}$.

The minimum VCO gain, $K_{VCO}$, is approximately 2.6 MHz/Volt, therefore the maximum VCO control voltage change, dV, for a 200 kHz step will be 80 millivolts.

The gain of the amplifier 18 coupled to the sampling capacitor 20 is scaled such that at least 90% of the full scale of the A/D converter 12 is utilized. The analog to digital conversion is accomplished immediately after the loop has settled to the desired frequency, $F_d$. The digital number proportional to the control voltage step change is loaded into the DAC 6 to reset the gain of the DAC 6. Once the loop has corrected for any transients produced by resetting the DAC 6 gain, the FM calibration cycle is complete.

Figure 2:
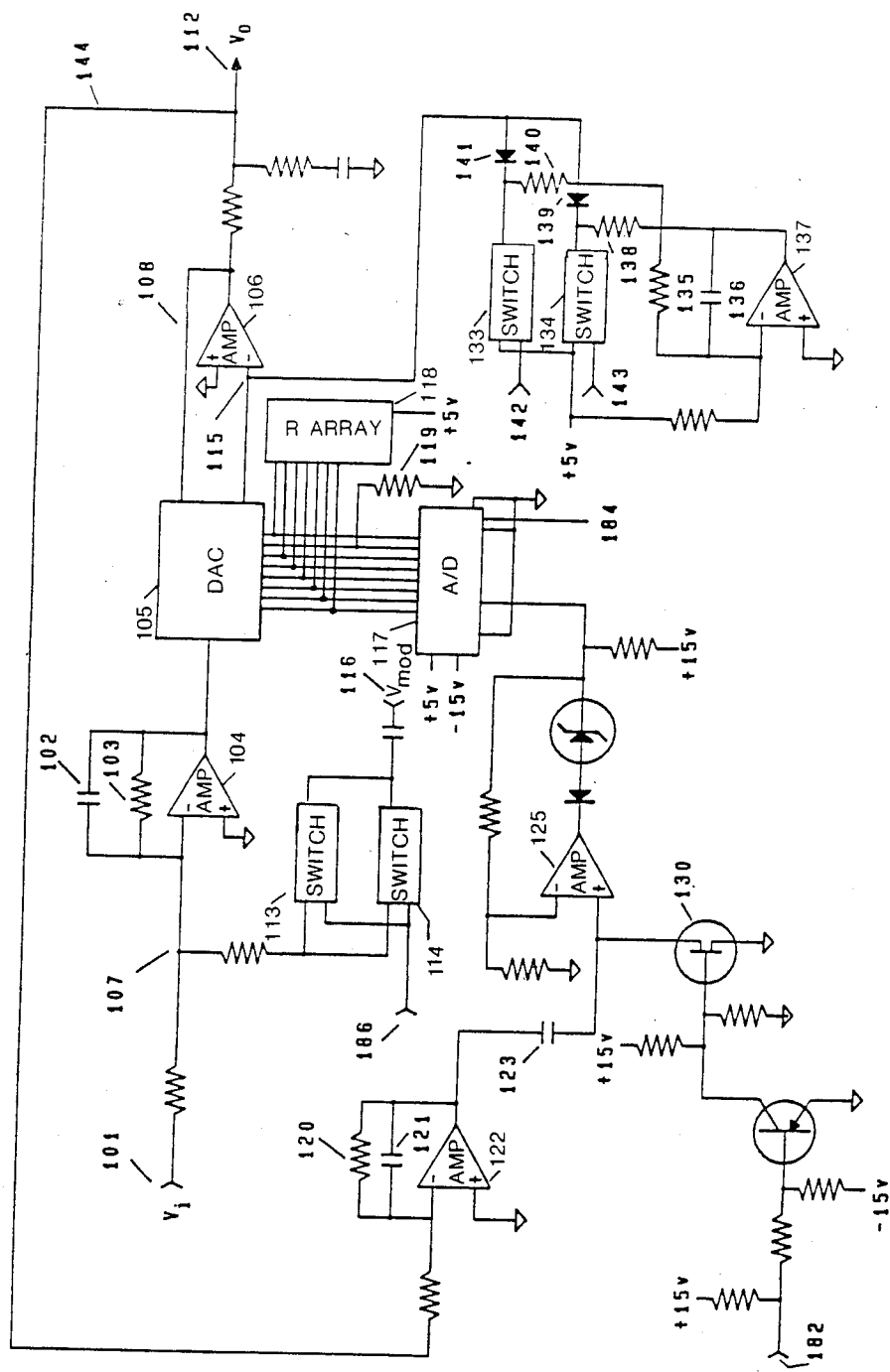
FIG. 2 is a schematic diagram of the FM calibration circuitry utilized in the phase-locked loop illustrated in FIG. 1.
Figure 3:
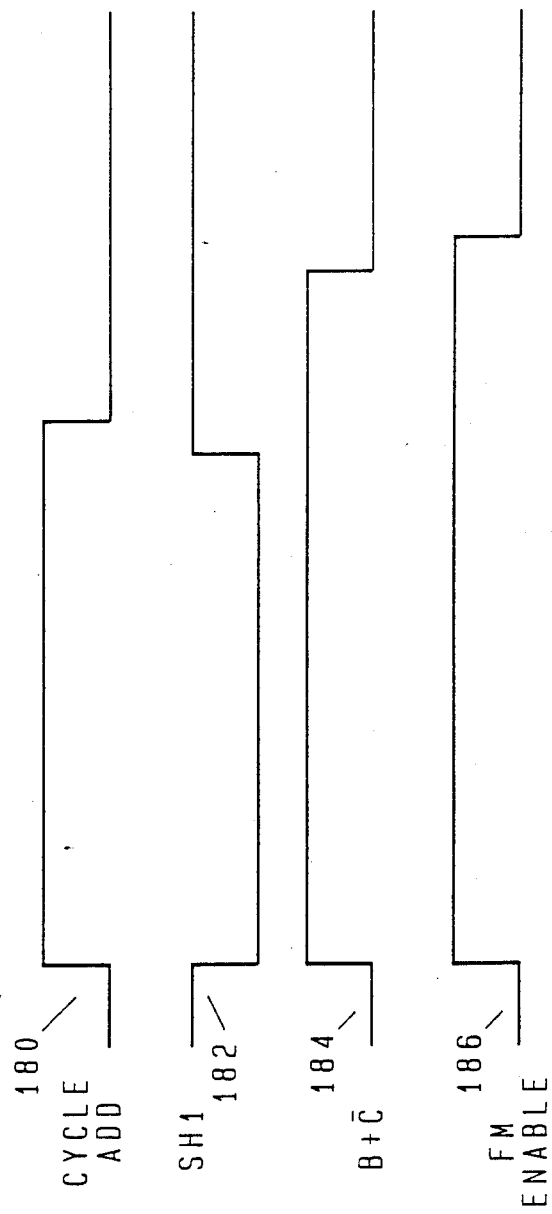
FIG. 3 is a timing diagram illustrating the timing signals which control the basic squence of events during an FM calibration cycle.

Referring now to FIG. 2, the modulation input signal 116 (shown as 2 on FIG. 1) is inputted to the summing node 107 through an electronic switch 113 and 114 which is controlled by the FM enable signal 186 (as shown in FIG. 3). The output of the loop filter (shown as 10 on FIG. 1), $V_i$ 101, is summed with the modulation input signal 116 at the summing node 107. OP-AMP 104, resistor 103 and capacitor 102 form an inverting amplifier which amplifies the summed signal and inputs it to the DAC 105. DAC 105 is a CMOS DAC which internally switches currents in an R-2R ladder either to ground or to the summing node 115 of an inverting amplifier 106. The DAC also includes a feedback resistor (not shown) connected by line 108 between the output of the inverting amplifier 106 and the summing node 115. The DAC 105 setting is loaded directly from the output of A/D converter 117. During most of the FM calibration cycle, a timing signal 184 (as shown in FIG. 3) forces the A/D converter 117 outputs to a tri-state mode. This sets the gain of the DAC 105 to 0.75 by pulling all input data lines high, except the second most significant digit, with the pull up resistors in resistor array 118 and resistor 119. Setting the DAC to a gain of 0.75 assures that the loop will be stable during frequency changes of the loop.

OP-AMP 122, resistor 120 and capacitor 121 comprise an inverting amplifier which serves as a buffer with a gain of one to sense the VCO control voltage, $V_o$ 112, on line 144. The sampling capacitor 123 (shown as capacitor 20 in FIG. 1) is connected to the output of the buffer amplifier 122 and couples the change in VCO control voltage resulting from the loop frequency step change of 200 kHz. At the start of an FM calibration cycle, the sample-hold signal 182 (as shown in FIG. 3) goes low, FET 130 switches capacitor 123 to ground allowing it to charge to the VCO control voltage on line 144. Once the loop has settled to $F_d$ plus 200 kHz, the sample-hold signal 182 goes high, opening the switch comprising FET 130 and the loop frequency is step changed to $F_d$. Capacitor 123 now sees a new control voltage on line 144 and couples the change in the control voltage resulting from the step change in loop frequency of 200 kHz to amplifier 125.

The output of the amplifier 125 is input to the A/D converter 117 is the Blank and Not Convert signal (B+/C) 184 (as shown in FIG. 3). At the start of an FM calibration cycle, the B+/C signal 184 goes high, forcing the output of the A/D converter 117 to go to a tri-state mode allowing resistor array 118 and resistor 119 to set the gain of DAC 105 to 0.75. When the B+/C signal goes low, the change in VCO control voltage input from differential amplifier 125 is converted to a digital number and loaded into the DAC 105 to adjust its gain.

At a VCO frequency of 60 MHz, the VCO has maximum gain ($K_{VCO}$) requiring a DAC gain setting of about 0.5. At 60 MHz, the VCO requires a control voltage of 10 volts which would require an input voltage to the DAC 105 of 20 volts which is greater than the output voltage of OP-AMPs in the circuit. OP-AMP 137, resistor 135, capacitor 136, resistors 138 and 140 and diodes 139 and 141 comprise a switchable current source which inputs an offset current as a function of the loop frequency to the summing node 115 to be summed with the output of the DAC 105. Electronic switches 133 and 134 sense the loop frequency on lines 142 and 143. At a loop frequency of 60 MHz the output of switches 133 and 134 are both open, allowing current to flow through both resistors 138 and 140. Resistor 138 will cause a 6 volt offset at the output of summing amplifier 106, resistor 140 will cause a 3 volt offset at the output of summing amplifier 106 and both resistors 138 and 140 will cause a 9 volt offset at the output of summing amplifier 106. Therefore, at 60 MHz a 9 volt offset at the output of summing amplifier 106 will require an input voltage of 2 volts at DAC 105 to provide a control voltage of 10 V to the VCO.

Referring now to FIG. 2 and FIG. 3, whenever it is desired to tune the PLL to a new frequency, $F_d$, an FM calibration cycle is initiated by a host microprocessor and the timing signals illustrated in FIG. 3 are generated. When the desired frequency, $F_d$, is loaded into the host microprocessor, a new number N is generated to be used by the divide-by-N block 26 (as shown in FIG. 1) to force the loop to the new frequency $F_d$. At the same time, an FM enable signal 186 goes high, opening CMOS switches 113 and 114 to interrupt the modulation input signal 116 path; the blank-not convert (B+$\overline{C}$) 184 signal goes high forcing the A/D converter 117 output to go tri-state which sets the gain of the DAC 105 at 0.75; the sample signal (SH1) 182 goes low, grounding sampling capacitor 123 through FET 130; and the add cycle signal 180 goes high, changing the modulus of the prescaler 22 (as shown in FIG. 1) from ten to nine. When the loop has settled to $F_d$ plus 200 kHz, SH1 182 goes high, holding the tune voltage on capacitor 123. When the cycle add signal 180 goes low, the prescaler 22 modulus is changed from nine back to ten and the loop settles at $F_d$. The differential tune voltage resulting from the 200 kHz step change is now on the sampling capacitor 123 and is scaled by amplifier 125 and input to the A/D converter 117. B+$\overline{C}$ 184 now goes low, the A/D converter output is no longer tri-state and the differential tune voltage is converted to a digital number and loaded into the DAC 105 resetting the gain of the DAC 105 from 0.75 to the required new gain. When the loop transients resulting from the new gain setting are compensated for, FM enable 186 goes low, closing the CMOS switches 113 and 114, and the FM calibration cycle is complete.

We claim:

1. An electronic apparatus for calibrated frequency modulation of a multiplicity of frequencies which are desired multiples of a reference frequency generated in a phase-locked loop, said apparatus comprising:

frequency generating means for producing an output signal with a frequency determined by the level of a control input signal;

counting means coupled to the output of the frequency generating means for producing an output signal having a frequency equal to the frequency of the signal at the input of the counting means divided by N;

phase comparison means coupled to the counting means for comparing the phases of the output signal from the counting means and the reference signal, and generating an error signal indicative of a phase difference therebetween, said error signal serving as the control input signal to the frequency generating means to thereby control the frequency of the output signal from the frequency generating means;

input summing means coupled to the output of the phase comparison means and to the input of the frequency generating means for summing a frequency modulation signal with the control input signal for producing frequency modulation of the output signal from the frequency generating means;

frequency change means coupled to the counting means, responsive to a frequency step change signal, for changing the frequency of the input signal to the counting means thereby forcing the phase-locked loop to step change the frequency of the frequency generating means output signal by a multiple of the reference signal frequency;

sampling means coupled to the input of the frequency generating means for detecting a change in the control input signal and providing an output signal linearly proportional to said change in the control input signal; and amplitude adjustment means coupled to the sampling means and responsive to the output of the sampling means for adjusting the amplitude of the control input signal, said adjustment of the amplitude of the control input signal being proportional to the output of the sampling means.

2. Apparatus as in claim 1 wherein said frequency change means comprises a phase shift means interposed between the frequency generating means and the counting means, for shifting the phase of the input signal to the counting means by a multiple of two pi radians of phase thereby forcing the phase-locked loop to step change the frequency of the frequency generating means output signal by said multiple of the reference signal.

3. Apparatus as in claim 2 wherein said phase shift means comprise cycle addition means for adding at least one cycle to the input of the counting means thereby adding a multiple of two pi radians of phase to the input signal to the counting means.

4. Apparatus as in claim 3 wherein said cycle addition means comprise a divide-by-two flip-flop coupled to a three-modulus prescaler.

5. Apparatus as in claim 1 wherein said sampling means comprises a capacitor coupled to ground through an electrode switch, said capacitor detecting said change in the control input signal level.

6. Apparatus as in claim 5 wherein said sampling means further comprises an analog-to-digital converter coupled to said capacitor and to the amplitude adjustment means, said analog-to-digital converter converting said change in the control input signal level to a digital signal indicative of said change in the control input signal level.

7. Apparatus as in claim 6 wherein said amplitude adjustment means comprises a variable-gain amplifier responsive to said digital signal for amplifying the amplitude of the control input signal proportionally to said digital signal.

8. Apparatus as in claim 7 wherein said variable-gain amplifier comprises a multiplying digital-to-analog converter interconnected between said input summing means and said frequency generating means, said digital signal adjusting the gain of said multiplying digital-to-analog converter.

9. Apparatus as in claim 8 wherein said amplitude adjustment means further includes a voltage offset circuit coupled to the output of the multiplying digital-to-analog converter for providing an offset voltage, said offset voltage being summed with the output of the digital-to-analog converter, the level of said offset voltage being determined by the frequency of the frequency generating means output signal.

* * * * *

UNITED STATES PATENT AND TRADEMARK OFFICE
CERTIFICATE OF CORRECTION

PATENT NO. : 4,573,026

DATED : February 25, 1986

INVENTOR(S) : G. Stephen Curtis and David P. Whipple

It is certified that error appears in the above-identified patent and that said Letters Patent is hereby corrected as shown below:

In Claim 5, Column 6, line 51 of the Patent, delete "electrode" and insert -- electronic --.

Signed and Sealed this

Thirteenth Day of January, 1987

Attest:

DONALD J. QUIGG

Attesting Officer

Commissioner of Patents and Trademarks